(12) United States Patent
Bonitz

(10) Patent No.: US 11,120,844 B1
(45) Date of Patent: Sep. 14, 2021

(54) POWER SWITCHING FOR EMBEDDED MEMORY

(71) Applicant: Micron Technology, Inc., Boise, ID (US)

(72) Inventor: Rainer Frank Bonitz, Bruckmühl (DE)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/006,143

(22) Filed: Aug. 28, 2020

(51) Int. Cl.
*G11C 5/14* (2006.01)
*G11C 7/20* (2006.01)
*G11C 11/00* (2006.01)

(52) U.S. Cl.
CPC .............. *G11C 5/147* (2013.01); *G11C 5/143* (2013.01); *G11C 7/20* (2013.01); *G11C 11/005* (2013.01)

(58) Field of Classification Search
CPC ........... G11C 5/143; G11C 5/147; G11C 7/20; G11C 11/005
USPC ....................................................... 365/226
See application file for complete search history.

(56) References Cited

U.S. PATENT DOCUMENTS

| | | | |
|---|---|---|---|
| 6,919,756 B2* | 7/2005 | Callaway | G06F 1/26 327/536 |
| 6,925,026 B2* | 8/2005 | Isono | G11C 5/14 257/E23.153 |
| 7,701,787 B2* | 4/2010 | Chen | G06F 13/1668 365/189.11 |
| 9,905,275 B2* | 2/2018 | Mirichigni | G06F 13/1668 |
| 10,013,042 B1* | 7/2018 | Abhishek | G06F 1/3275 |
| 10,867,684 B1* | 12/2020 | Piccardi | G11C 16/32 |

OTHER PUBLICATIONS

Micron Technology, Inc. "TN-FC-14: e•MMC Power Loss Data Integrity," <www.micron.com>, 2012 (18 pages).

* cited by examiner

*Primary Examiner* — Son L Mai
(74) *Attorney, Agent, or Firm* — Holland & Hart LLP

(57) ABSTRACT

Methods, systems, and devices for power switching for embedded memory are described. A system may be configured with circuitry (e.g., power supply switching circuitry) coupled with or between a power supply and a power input node of a memory device, which may support selectively coupling or isolating the memory device and the power supply based on various conditions. For example, the circuitry may be configured for a selective coupling or a selective isolation based on a voltage level of the power supply satisfying various voltage thresholds. The circuitry may also be configured to support various input or output signaling, such as transmitting an indication of an isolation from the power supply, transmitting an indication to perform a memory initialization, or receiving an indication or command to perform a power cycle.

20 Claims, 5 Drawing Sheets

POWER SWITCHING FOR EMBEDDED MEMORY

BACKGROUND

The following relates generally to one or more memory systems and more specifically to power switching for embedded memory.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), 3-dimensional cross-point memory (3D cross point), not-or (NOR), and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
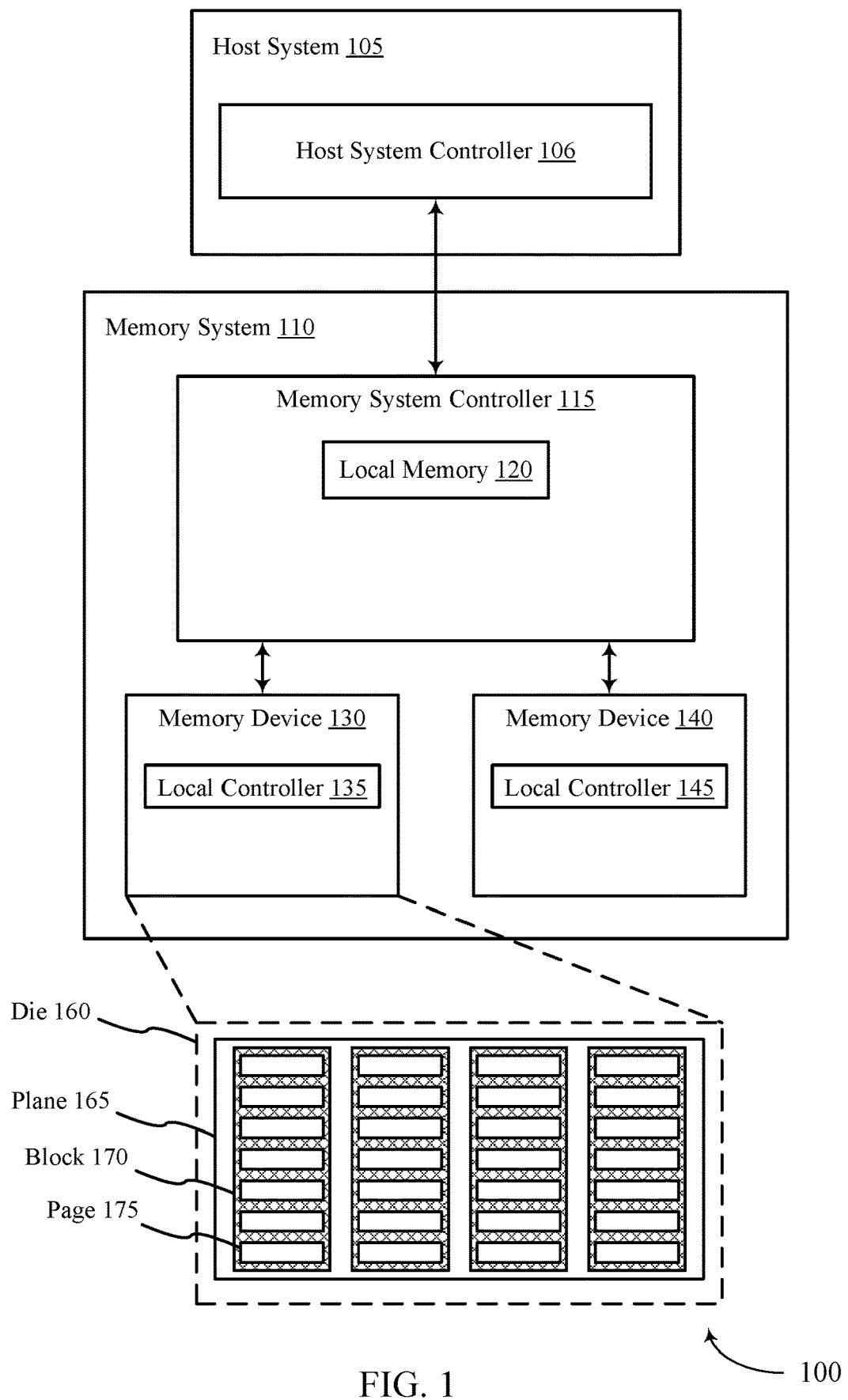
FIG. 1 illustrates an example of a system that supports power switching for embedded memory in accordance with examples as disclosed herein.

In some systems, a memory device may be provided with power from a power supply, such as a power supply of a host device or a power supply that shares a substrate or other packaging with the memory device, among other examples. Power may be provided to a power input node of the memory device according to a voltage regulated by the power supply (e.g., by a voltage regulator of the power supply). In some cases, however, a level of a voltage or a rate of change of a voltage (e.g., a slew rate) provided by the power supply may be inadequate for supporting some operations of the memory device, or may cause the memory device to enter or operate in an error state or an indeterminate state, or may trigger a reboot or reinitialization of the memory device, among other operations that may result in adverse performance or undue latency.

In accordance with examples as disclosed herein, a system may be configured with circuitry (e.g., power supply switching circuitry), which may be coupled with or between a power supply and a power input node of a memory device. The circuitry may be configured in place of or as an alternative to a direct connection between the power supply and the power input node of the memory device, and may support selectively coupling or selectively isolating the memory device and the power supply based on one or more conditions (e.g., one or more detected conditions, one or more commands, one or more configured durations). For example, the circuitry may be configured to selectively couple the power input node of the memory device with the power supply based on a voltage level of the power supply satisfying (e.g., meeting, exceeding, rising above) a voltage threshold. Additionally or alternatively, the circuitry may be configured to selectively isolate the power input node of the memory device from the power supply based on a voltage level of the power supply satisfying (e.g., not meeting, not exceeding, falling below) a voltage threshold, which may include an isolation for at least a configured duration (e.g., a power cycle duration). The circuitry may also be configured to support various input signaling or output signaling, such as transmitting an indication (e.g., to a host device) that the power input node of the memory device was isolated from the power supply, transmitting an indication (e.g., to a host device) to perform a reinitialization of or with the memory device (e.g., based on an isolation of the power input node of the memory device from the power supply), or receiving an indication or command (e.g., from a host device) to perform a power cycle (e.g., a triggered or commanded isolation of the memory device from the power supply, which may be followed by a re-coupling or reconnection after a power cycle duration). By supporting these and other techniques in accordance with examples as disclosed herein, power supply switching circuitry may improve various operations of a memory device, of a host device, of or a system that includes a memory device and a host device, including various improvements to reliability, latency or throughput, and data retention, among other benefits.

Features of the disclosure are initially described in the context of systems, devices and associated power conditions as described with reference to FIGS. 1 through 3. These and other features of the disclosure are further illustrated by and described with reference to an apparatus diagram and flowcharts that relate to power switching for embedded memory as described with reference to FIGS. 4 and 5.

FIG. 1 is an example of a system 100 that supports power switching for embedded memory in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), a non-volatile DIMM (NVDIMM), an embedded memory device, or a managed memory device, among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any computing device that includes memory and a processing device.

The system 100 may include a host system 105, which may be coupled with the memory system 110. In some examples, this coupling may include an interface with a host system controller 106, which may be an example of a control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., PCIe controller, SATA controller). The host system 105 may use the memory system 110, for example, to write data to the memory system 110 and read data from the memory system 110. Although one memory system 110 is shown in FIG. 1, it is to be understood that the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a serial advanced technology attachment (SATA) interface, a UFS interface, an eMMC interface, a peripheral component interconnect express (PCIe) interface, a USB interface, Fiber Channel, Small Computer System Interface (SCSI), Serial Attached SCSI (SAS), Double Data Rate (DDR), a dual in-line memory module (DIMM) interface (e.g., DIMM socket interface that supports DDR), Open NAND Flash Interface (ONFI), Low Power Double Data Rate (LPDDR). In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 or memory device 140 included in the memory system 110, or via a respective physical host interface for each type of memory device 130 or memory device 140 included in the memory system 110.

The memory system 110 may include a memory system controller 115, a memory device 130, and a memory device 140. A memory device 130 may include one or more memory arrays of a first type of memory cells (e.g., a type of non-volatile memory cells), and a memory device 140 may include one or more memory arrays of a second type of memory cells (e.g., a type of volatile memory cells). Although one memory device 130 and one memory device 140 are shown in the example of FIG. 1, it is to be understood that memory system 110 may include any quantity of memory devices 130 and memory devices 140, and that, in some cases, memory system 110 may lack or omit either a memory device 130 or a memory device 140.

The memory system controller 115 may be coupled with and communicate with the host system 105 (e.g., via the physical host interface), and may be an example of a control component configured to cause the memory system 110 to perform various operations in accordance with examples as described herein. The memory system controller 115 may also be coupled with and communicate with memory devices 130 or memory devices 140 to perform operations such as reading data, writing data, erasing data, or refreshing data at a memory device 130 or a memory device 140, and other such operations, which may generically be referred to as access operations. In some cases, the memory system controller 115 may receive commands from the host system 105 and communicate with one or more memory devices 130 or memory devices 140 to execute such commands (e.g., at memory arrays within the one or more memory devices 130 or memory devices 140). For example, the memory system controller 115 may receive commands or operations from the host system 105 and may convert the commands or operations into instructions or appropriate commands to achieve the desired access of the memory devices 130 or memory devices 140. And, in some cases, the memory system controller 115 may exchange data with the host system 105 and with one or more memory devices 130 or memory devices 140 (e.g., in response to or otherwise in association with commands from the host system 105). For example, the memory system controller 115 may convert responses (e.g., data packets or other signals) associated with the memory devices 130 or memory devices 140 into corresponding signals for the host system 105.

The memory system controller 115 may be configured for other operations associated with the memory devices 130 or memory devices 140. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130 or memory devices 140.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions)

executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored to the local memory 120 when read from or written to a memory device 130 or memory device 140, and may be available within the local memory 120 for subsequent retrieval for or manipulation (e.g., updating) by the host system 105 (e.g., with reduced latency relative to a memory device 130 or memory device 140) in accordance with a cache policy.

Although the example of memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135 or local controllers 145, which may be internal to memory devices 130 or memory devices 140, respectively, to perform the functions ascribed herein to the memory system controller 115. In general, one or more functions ascribed herein to the memory system controller 115 may in some cases instead be performed by the host system 105, a local controller 135, or a local controller 145, or any combination thereof.

A memory device 140, where included in a memory system 110, may include one or more arrays of volatile memory cells. For example, a memory device 140 may include random access memory (RAM) memory cells, such as dynamic RAM (DRAM) memory cells and synchronous DRAM (SDRAM) memory cells. In some examples, a memory device 140 may support random access operations (e.g., by the host system 105) with reduced latency relative to a memory device 130, or may offer one or more other performance differences relative to a memory device 130.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric RAM (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), and electrically erasable programmable ROM (EEPROM).

In some examples, a memory device 130 or a memory device 140 may include (e.g., on a same die or within a same package) a local controller 135 or a local controller 145, respectively, which may execute operations on one or more memory cells of the memory device 130 or the memory device 140. A local controller 135 or a local controller 145 may operate in conjunction with a memory system controller 115 or may perform one or more functions ascribed herein to the memory system controller 115. In some cases, a memory device 130 or a memory device 140 that includes a local controller 135 or a local controller 145 may be referred to as a managed memory device and may include a memory array and related circuitry combined with a local (e.g., on-die or in-package) controller (e.g., local controller 135 or local controller 145). An example of a managed memory device is a managed NAND (MNAND) device.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, performing concurrent operations in different planes 165 may be subject to one or more restrictions, such as identical operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

The system 100 may include any quantity of non-transitory computer readable media that support power switching for embedded memory. For example, the host system 105, the memory system controller 115, a memory device 130, or a memory device 140 may include or otherwise may access one or more non-transitory computer readable media storing instructions (e.g., firmware) for performing the functions ascribed herein to the host system 105, memory system controller 115, memory device 130, or memory device 140. For example, such instructions, when executed by the host system 105 (e.g., by the host system controller 106), by the memory system controller 115, by a memory device 130 (e.g., by a local controller 135), or by a memory device 140 (e.g., by a local controller 145), may cause the host system 105, memory system controller 115, memory device 130, or memory device 140 to perform one or more associated functions as described herein.

In some examples of the system 100, a memory system 110, or a component thereof (e.g., a memory device 130, a memory device 140), may be provided with power from a power supply, such as a power supply of the host system 105 or a power supply that may or may not be shared with the host system 105, among other examples. Power may be provided to a power input node (e.g., of the memory system 110, of the memory device 130, of the memory device 140) according to a voltage regulated by the power supply. In some cases, however, a level of a voltage or a rate of change of a voltage (e.g., a slew rate) provided by the power supply may be inadequate for supporting some operations, such as memory-related operations.

In accordance with examples as disclosed herein, the system 100, or an apparatus that includes one or more components of the system 100, may be configured with circuitry (e.g., power supply switching circuitry), which may be coupled with or between a power supply and a power input node of a memory device (e.g., of a memory system 110, of a memory device 130, of a memory device 140). The circuitry may be configured in place of or as an alternative to a direct connection between the power supply and the power input node, and may support selectively coupling or selectively isolating the power input node and the power supply based on various conditions (e.g., detected conditions, commands, configured durations). The circuitry may also be configured to support various input or output signaling, such as transmitting an indication (e.g., to a host system 105, to a memory system controller 115) that the power input node was isolated from the power supply, transmitting an indication to perform a reinitialization (e.g., a reinitialization of the memory device, based on an isolation of the power input node from the power supply), or receiving an indication or command to perform a power cycle (e.g., a triggered or commanded isolation from the power supply, which may be followed by a re-coupling or reconnection after a configured power cycle duration). By supporting these and other techniques in accordance with examples as disclosed herein, power supply switching circuitry may improve various operations, including operations of a host system 105, of a memory system 110, of a memory device 130 or a memory device 140, or of another system that includes one or more of such components.

Figure 2:
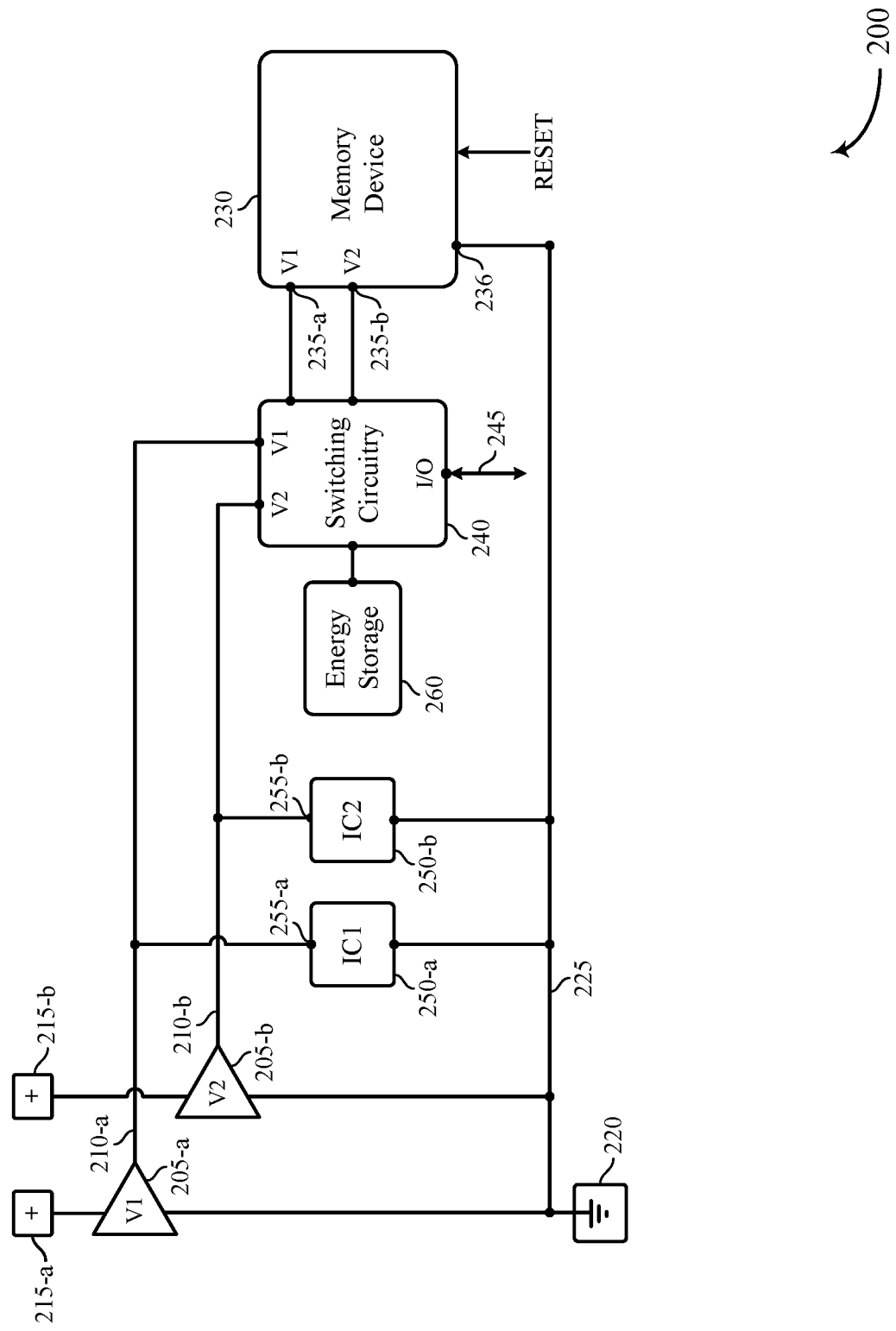
FIG. 2 illustrates a block diagram of an apparatus that supports power switching for embedded memory in accordance with examples as disclosed herein.

FIG. 2 illustrates an example of an apparatus 200 that supports power switching for embedded memory in accordance with examples as disclosed herein. The apparatus 200 includes a memory device 230, which may be an example of a memory system 110, a memory device 130, or a memory device 140 as described with reference to FIG. 1, among other types or configurations of a memory device. The memory device 230 includes a power input node 235-a (e.g., associated with an input voltage, V1), and a power input node 235-b (e.g., associated with an input voltage V2). Although the memory device 230 is illustrated with two power input nodes 235, a memory device 230 in accordance with the described techniques may include any quantity of one or more power input nodes 235. The memory device 230 may include memory cells having a useful degree of non-volatility (e.g., NAND memory cells, chalcogenide memory cells, phase change memory cells, thresholding memory cells, resistive memory cells), such that the memory device 230 may support data storage through a duration of power disturbance, loss, or removal from the power input nodes 235.

To support operation of the memory device 230, the power input nodes 235 of the memory device 230 may be configured to be coupled with or connected with a respective power supply 205 (e.g., a voltage regulator) that provides power to the memory device 230 according to a respective regulated voltage. For example, the apparatus 200 may include a power supply 205-a, coupled with an energy source 215-a and a ground source 220 (e.g., a ground or chassis ground, or other voltage reference), and associated with providing power to a supply line 210-a according to the voltage, V1. In some examples, the apparatus 200 may also include a power supply 205-b, coupled with an energy source 215-b (e.g., a power source that may be the same as or different than the energy source 215-a) and the ground source 220, and associated with providing power to a supply line 210-b according to the voltage, V2. Although the apparatus 200 is illustrated with two power supplies 205, an apparatus 200 in accordance with the described techniques may include any quantity of one or more power supplies 205.

The supply lines 210 may refer to power planes of a printed circuit board (PCB) of the apparatus 200, or some other substrate or packaging (e.g., of a multi-chip package) that may be common to one or more components of the apparatus 200. The apparatus may also include a ground line 225, which may refer to a ground plane or other chassis ground of the apparatus 200, having a voltage from which other voltages are referenced. In some examples, the memory device 230 may include a ground node 236 configured to be coupled with or connected to the ground line 225 or the ground source 220. Although a single (e.g., common) ground line 225 coupled to a single ground source 220 is illustrated, an apparatus in accordance with examples as disclosed herein may include more than one ground line 225, each of which may be coupled or connected with an independent ground source 220 (e.g., in an apparatus 200 having multiple ground sources 220 that may be isolated from each other).

The memory device 230 may rely on certain power characteristics from the power supplies 205, such as certain voltage levels, certain voltage rates (e.g., slew rates), voltages or voltage rates being within a range, or various combinations thereof. For example, if a voltage level at one or more power input nodes 235 of the memory device 230 falls below a threshold level, or falls below a threshold level for a configured duration (e.g., falls below 0.5V for at least one millisecond), the memory device 230 may be configured to shut down, to enter an idle state, or to perform an initialization sequence, or to perform other operations or combinations of operations. In some examples, the memory device 230 may be configured according to a power cycle associated with a voltage at a power input node 235 being maintained below a threshold level for some duration (e.g., a power cycle duration, an "off" duration, a duration between a power-down and power-up, a power input node 235 being below 0.3V for at least one second during a power cycle). In some examples, the memory device 230 may rely on a power-up slew rate at a power input node 235 satisfying (e.g., meeting or exceeding) a threshold rate in order to boot or initialize.

In some architectures, a power supply 205 may be designed to meet various voltage input constraints of a memory device 230, which may support a power input node 235 of the memory device 230 being directly connected with a supply line 210 or a power supply 205. In some examples (e.g., in an embedded or managed memory application), however, a power supply 205 designed to support a direct connection with a memory device 230 may be over-provisioned in a given application, or an associated system may include other components that share a power supply 205 with a memory device 230.

For example, the apparatus 200 may include an integrated circuit 250-a (e.g., one or more circuit components) coupled with or between the supply line 210-a and the ground line 225, or an integrated circuit 250-b (e.g., one or more circuit components that may or may not be common with circuit components of the integrated circuit 250-a) coupled with or between the supply line 210-b and the ground line 225, or both.

The integrated circuits 250 may include various components such as processing components (e.g., a computing component, a microprocessor, a host system controller 106, a host system 105), interfacing components (e.g., bus components, I/O components, a USB interface, peripheral components), amplifier components (e.g., an audio amplifier) or other power system or conversion components, or any other type of component that shares a power supply 205 (e.g., a common or centralized power supply) with the memory device 230. In various examples, components of the integrated circuits 250 may be directly or selectively coupled with a supply line 210 or the ground line 225, and may have different (e.g., less restrictive) operating constraints from the supply line 210 or related power supply 205 than a memory device 230.

In some examples, an integrated circuit 250 may impose a disturbance to voltage characteristics of a supply line 210. For example, as part of a power-up, boot cycle, or initialization of the apparatus 200, integrated circuits 250 may cause voltage of a supply line 210 to rise relatively slowly (e.g., at a lower or shallower slew rate) as a power supply 205 is enabled, which may be related to charging or initialization power consumption of the integrated circuit 250. In some examples, an integrated circuit 250 may experience an intermittent power demand or other operating behavior that draws a relatively high power, which may cause a temporary reduction of a voltage level of a supply line 210. In some examples, such a reduction may be relatively short in duration, but nonetheless may cause or lead to a reinitialization of the memory device 230, which itself may lead to or rely on power being removed or isolated for a power cycle duration. Thus, according to these and other examples, integrated circuits 250 may be associated with operations where voltage characteristics of a supply line 210 may be inadequate or unfavorable for supporting some operations of the memory device 230.

In some examples, a memory device 230 itself be associated with conditions that relate to or otherwise involve a power cycle, which may not necessarily involve a power cycle of a component of an integrated circuit 250. For example, a memory device 230 may experience an error condition, which may be related to an access or operating error of the memory device 230, or may be a result of a disturbance such as cosmic rays, static discharge, thermal or mechanical shock, or some other type of disturbance. In some examples, the memory device 230 may perform a reinitialization to support a firmware update or other firmware or application reloading. In these and other circumstances, the memory device 230 may rely on a power cycle that isolates power input nodes 235 from a power supply 205. However, integrated circuits 250 may not rely on the same power cycling behavior, and may be associated with undesirable latency or other operating condition if they were isolated from the power supplies 205 or if the power supplies 205 were otherwise disabled or powered down. For example, a firmware update or loading operation that includes a power cycle of a memory device 230 may be associated with a duration of 50 to 100 milliseconds (e.g., to support loading firmware and establishing a link with a host), which may be within a normal delay or latency associated with idle or background operation of the memory device 230, whereas a power cycle of an integrated circuit 250 that involves rebooting an operating system may take 5 to 15 seconds.

In accordance with examples as disclosed herein, the apparatus 200 may include switching circuitry 240 coupled between power input nodes 235 and the power supplies 205, which may be configured for selective coupling or isolating based on various conditions (e.g., detected or evaluated conditions, power plane distortions, commands, configured durations). For example, the switching circuitry 240 (e.g., a first portion of the switching circuitry 240) may be configured to selectively couple the power input node 235-a with the power supply 205-a (e.g., with the supply line 210-a) based on a voltage level of the power supply 205-a or the supply line 210-a satisfying (e.g., meeting, exceeding, rising above) a voltage threshold. Additionally or alternatively, the switching circuitry 240 may be configured to selectively isolate the power input node 235-a from the power supply 205-a based on a voltage level of the power supply 205-a or the supply line 210-a satisfying (e.g., not meeting, not exceeding, falling below) a voltage threshold, which may include supporting or maintaining an isolation for at least a configured duration (e.g., a power cycle duration). In some examples, the switching circuitry 240 (e.g., a second portion of the switching circuitry 240) may be configured to selectively couple or isolate the power input node 235-b with the power supply 205-b (e.g., with the supply line 210-b) based on a voltage level of the power supply 205-b or the supply line 210-b satisfying one or more voltage thresholds. The selective coupling or isolation of the switching circuitry 240 may be provided by various switching components, such as one or more transistors, relays, or other controllable switches of the switching circuitry 240. Although illustrated outside the memory device 230, in some examples, switching circuitry 240 may be included within the memory device 230 (or may include a combination of components outside the memory device 230 and included within the memory device 230), such as being implemented as on-chip switching circuitry as part of a memory device 130 or memory die 160.

In some examples, the switching circuitry 240 may be configured to evaluate (e.g., determine) conditions of multiple power supplies 205 or multiple supply lines 210 to support a selective coupling. For example, the switching circuitry 240 may be configured to selectively couple the power input node 235-a with the power supply 205-a, or couple the power input node 235-b with the power supply 205-b, or both, based on a voltage level of the power supply 205-a or the supply line 210-a satisfying (e.g., rising above) a first voltage threshold and on a voltage level of the power supply 205-b or the supply line 210-b satisfying a second voltage threshold. Additionally or alternatively, the switching circuitry 240 may be configured to support a selective coupling or isolation of multiple power input nodes 235 based on an evaluation of a single power supply 205 or single supply line 210. For example, the switching circuitry 240 may be configured to selectively isolate the power input node 235-*a* from the power supply 205-*a*, and selectively isolate the power input node 235-*b* from the power supply 205-*b*, based on either a voltage level of the power supply 205-*a* or the supply line 210-*a* satisfying (e.g., falling below) a first voltage threshold or on a voltage level of the power supply 205-*b* or the supply line 210-*b* satisfying a second voltage threshold.

The switching circuitry 240 may also be configured to support signaling 245, which may include input signaling received by the switching circuitry 240, output signaling transmitted by the switching circuitry 240, or both. In some examples (e.g., based on a selective isolation by the switching circuitry 240), the signaling 245 may include transmitting an indication (e.g., to a host system 105) that a power input node 235 was isolated from a power supply 205, which may inform components of the apparatus 200 of a state or condition of the memory device 230. In some examples, the signaling 245 may include transmitting an indication or request to perform a reinitialization or link establishment of or with the memory device 230 (e.g., related to a power cycling of the memory device 230). In some examples, the switching circuitry 240 may be configured to signal a reset indication (e.g., to a RESET input of the memory device 230) before performing a selective isolation, which may enable the memory device 230 to perform operations to prepare for a loss of power.

In some examples, the signaling 245 may include receiving an indication or command to perform a power cycle (e.g., a triggered or commanded isolation of the memory device 230 from one or more power supplies 205, a "cold boot"), which may enable initiation of power cycling by other components of the apparatus 200 (e.g., for host-managed power cycling, for memory device-managed power cycling), which may or may not be accompanied by power cycling of other components (e.g., components of one or more integrated circuits 250). For example, a host system 105 or the memory device 230 may use signaling 245 to command a power cycling of the memory device 230 (e.g., a relatively short duration power cycle) while power is maintained to one or more integrated circuits 250, which may reduce delays or latencies that would otherwise be associated with an accompanying power cycling of the integrated circuits 250. In various examples, a duration for such a commanded power cycling (e.g., a duration before a selective coupling with a power supply 205) may be controlled by a commanding component, or the switching circuitry 240 may include a delay component or other logic that performs a selective coupling of the memory device 230 with one or more power supplies 205 after a configured duration (e.g., and meeting a threshold or other criteria performing a selective coupling).

In some examples, the apparatus 200 may include an energy storage component 260, which may include a capacitor, a battery, or a combination thereof that may be selectively coupled with the memory device 230 under various conditions. For example, the switching circuitry 240 may be configured to selectively couple one or more power input nodes 235 with the energy storage component 260 based on a voltage level of a supply line 210 (e.g., before cutting power entirely from a power input node 235), or selectively isolate a power input node 235 from the energy storage component 260 based on a voltage level of a supply line 210.

Figure 3:
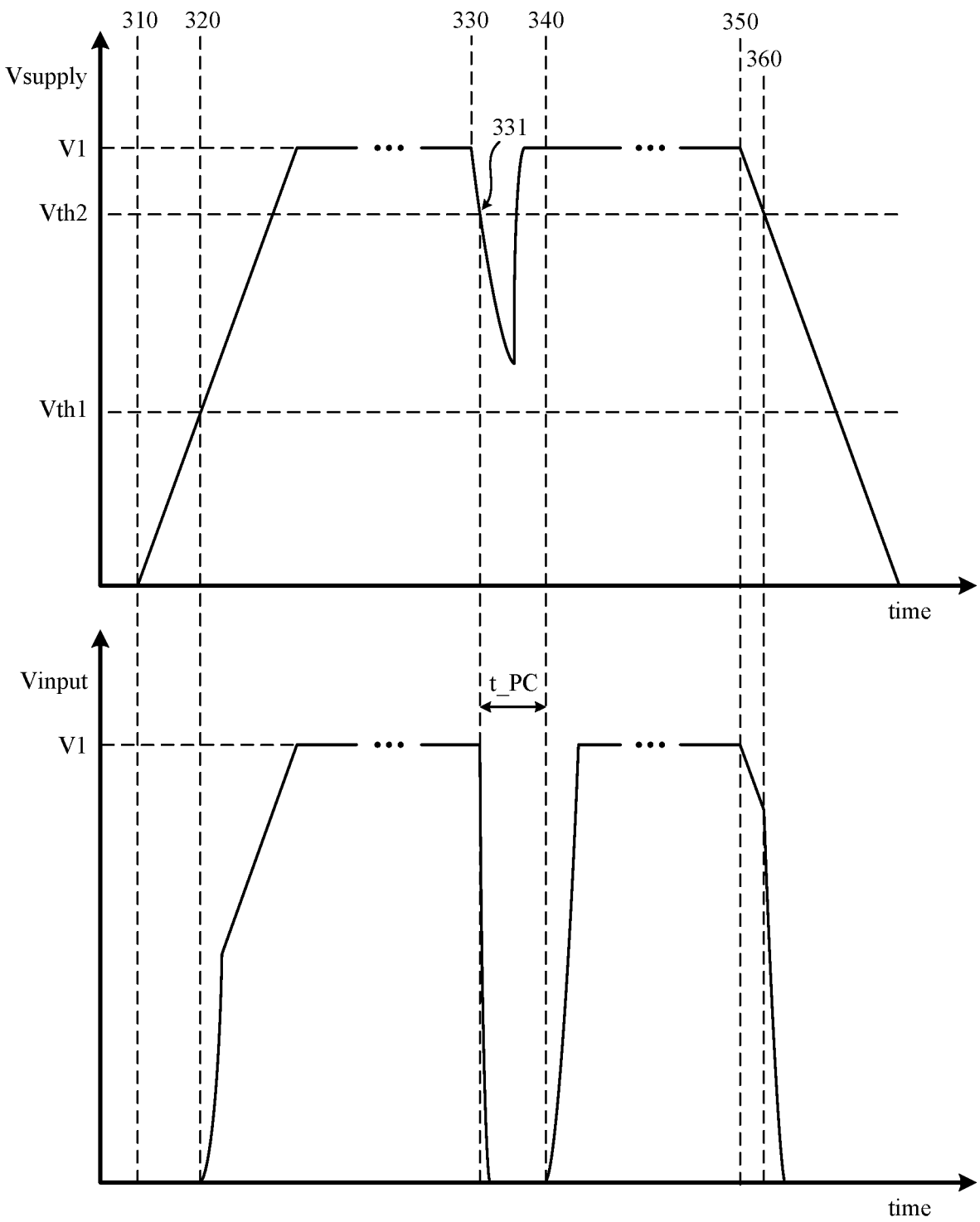
FIG. 3 illustrates an example of a timeline of power conditions that supports power switching for embedded memory in accordance with examples as disclosed herein.

FIG. 3 illustrates an example of a timeline 300 of power conditions that support power switching for embedded memory in accordance with examples as disclosed herein. The timeline 300 may be illustrative of operations of the apparatus 200 described with reference to FIG. 2. For example, the timeline 300 illustrates a voltage, Vsupply, over time, which may refer to a voltage of the power supply 205-*a* or to a voltage of the supply line 210-*a*. The timeline 300 also illustrates a voltage, Vinput, which may refer to a voltage of the power input node 235-*a* as provided by or via a selective coupling or isolation of the switching circuitry 240 (e.g., in response to Vsupply).

At 310, the apparatus 200 may be powered on, or undergo an activation, or boot-up operation. As part of such an operation, the energy source 215-*a* may be enabled, or the power supply 205-*a* may be enabled (e.g., coupled with an energy source 215-*a*), or both, such that Vsupply (e.g., a voltage of the supply line 210-*a*) rises. Vsupply may rise according to a slew rate related to powering or charging various components that share the power supply 205-*a*, such as integrated circuit 250-*a*, which may be selectively or fixedly coupled with the supply line 210-*a*. A relatively low voltage, or a relatively slow or shallow slew rate, may be inadequate or unfavorable for initializing the memory device 230. Accordingly, the switching circuitry 240 may selectively isolate the power input node 235-*a* from the supply line 210-*a* (e.g., suppressing an initial phase of a slow power ramp) through or after the operations of 310.

At 320, the voltage Vsupply may satisfy (e.g., meet, exceed, rise above) a first voltage threshold, Vth1. In response, the switching circuitry 320 may selectively couple the power input node 235-*a* with the supply line 210-*a*, such that the voltage at the input node, Vinput, rises to meet the supply voltage, Vsupply (e.g., associated with powering or charging various components of the memory device 230). By performing such a selective coupling, the switching circuitry 240 may support a shorter voltage rise duration at the memory device 230, which may provide a more stable initialization condition for the memory device 230. Moreover, by avoiding power consumption by the memory device 230 (e.g., over a duration between 310 and 320), such a selective coupling by the switching circuitry 240 may support a faster initialization of other components, such as components of the integrated circuit 250-*a*.

At 330, the apparatus 200, or a component thereof, may experience a disturbance, such as a disturbance to the energy source 215-*a* or the power supply 205-*a*, or an increased load of or power consumption by a component coupled with the supply line 210-*a* (e.g., a component of integrated circuit 250-*a*). For example, a processor or amplifier component of the integrated circuit 250-*a* may operate with a higher power or current draw due to one or more conditions, which may result in an intermittent drop of Vsupply. As a result of the voltage drop, Vsupply may satisfy (e.g., not meet, not exceed, fall below) a second voltage threshold, Vth2. In response, at 331, the switching circuitry 240 may selectively isolate the power input node 235-*a* from the supply line 210-*a*, such that the voltage at the input node, Vinput, falls to 0V.

In some examples, the memory device 230 may rely on a duration of being powered off (e.g., a power cycle duration), which may allow a voltage or charge of the memory device 230 to dissipate before being powered back on. Accordingly, the switching circuitry 240 may be configured to maintain the memory device 230 in a powered off state for at least a duration, t_PC, before selectively coupling the memory device 230 with one or more power supplies 205 (e.g., provided that other power supply conditions are met). For example, at 340 (e.g., a duration oft PC after the selective decoupling of 331), the switching circuitry may selectively couple the power input node 235-*a* with the supply line 210-*a*, such that the voltage at the power input node 235-*a*, Vinput, rises to meet the supply voltage, Vsupply. In some examples, the selective coupling of 340 may be based at least in part on the supply voltage, Vsupply, satisfying the first voltage threshold, Vth1. Although illustrated in the context of a detected drop in voltage, Vsupply, a similar power cycle may additionally or alternatively be performed in response to a command, such as when the operations of 331 and 340 are performed in response to a command received in signaling 245.

At 350, the apparatus 200 may perform a shutdown or idling operation which may include a disabling of the energy source 215-*a* or the power supply 205-*a*. As a result, Vsupply may begin to drop towards 0V. Vsupply may fall according to a slew rate related to discharging of various components that are coupled with the supply line 210-*a*, and a slow or shallow slew rate may be unfavorable for various reasons. For example, when the memory device 230 relies on the power input node 235-*a* being below a threshold voltage for at least a configured duration (e.g., a power cycle duration), a shallow slew rate may delay or prevent a selective coupling of the power input node 235-*a* with the supply line 210-*a*. Thus, rather than waiting for Vinput to fall naturally back to a ground voltage or below some other threshold, at 360, when Vsupply satisfies the second voltage threshold, Vth2 (or some other shutdown-specific or cutoff voltage threshold), the switching circuitry 240 may selectively isolate the power input node 235-*a* from the supply line 210-*a*. Thus, the voltage at the power input node 235-*a*, Vinput, may fall towards 0V more quickly than the supply voltage, Vsupply, which may reduce a delay or latency associated with returning power to the memory device 230.

According to these and other examples, implementing switching circuitry 240 in an apparatus 200 may improve various operations of the memory device 230, or of the apparatus 200 as a whole, including various improvements to reliability, latency or throughput, and data retention, among other benefits. In various examples, the described thresholds and durations may be configured at the switching circuitry 240 by a fixed configuration, by a variable configuration, or by a combination thereof. For example, a voltage threshold or a duration may be fixed by a hardware implementation (e.g., a circuit design) of the switching circuitry 240, or a voltage threshold or a duration may be configurable by a one-time programming (e.g., by way of fuses or anti-fuses), or a voltage threshold or a duration may be continuously configurable such as a programming by way of registers of or accessible by the switching circuitry 240.

Figure 4:
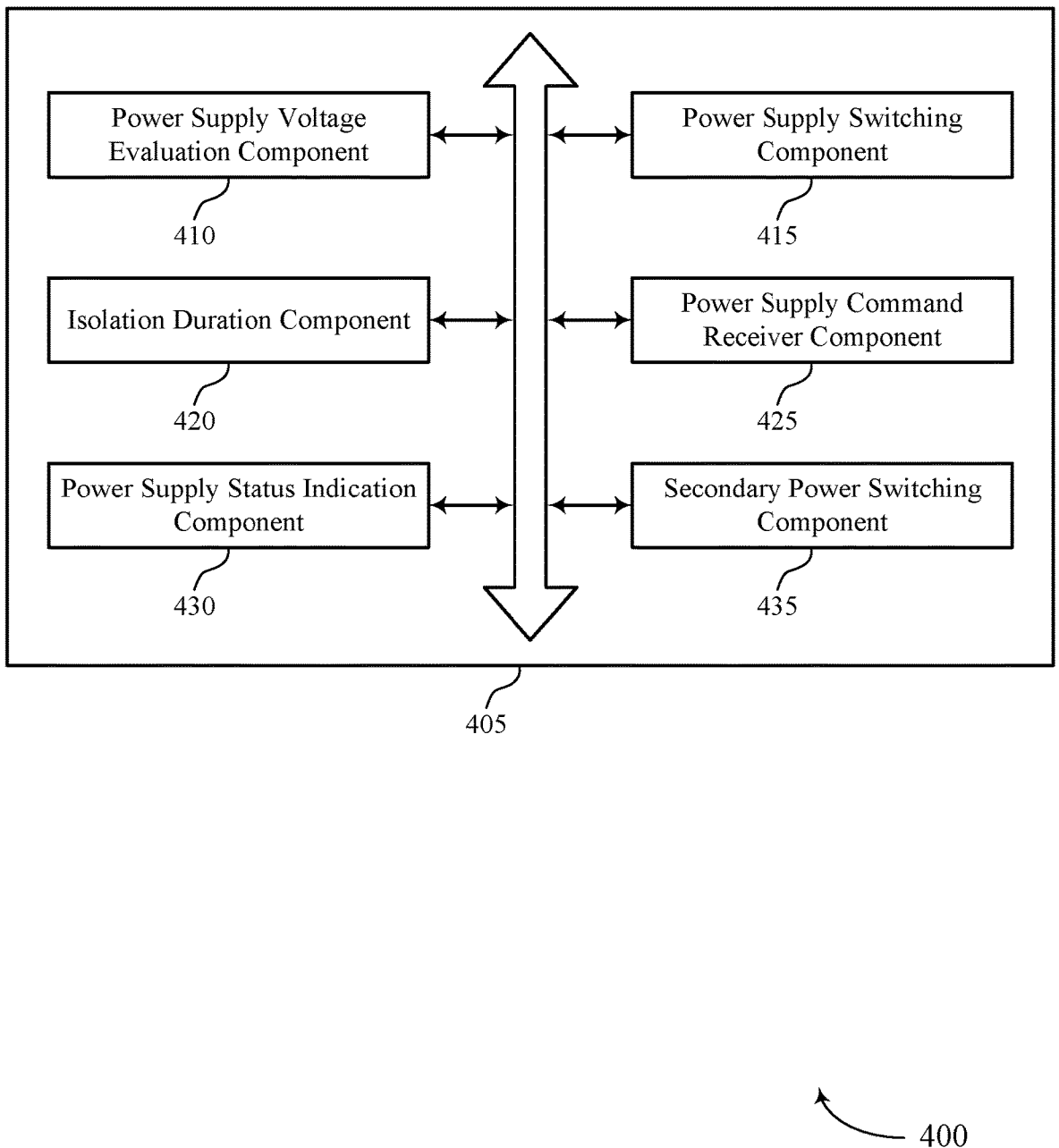
FIG. 4 shows a block diagram of power switching circuitry that supports power switching for embedded memory in accordance with examples as disclosed herein.

FIG. 4 shows a block diagram 400 of power switching circuitry 405 that supports power switching for embedded memory in accordance with examples as disclosed herein. The power switching circuitry 405 may be an example of aspects of power switching circuitry as described with reference to FIGS. 1 through 3. The power switching circuitry 405 may be coupled with a power supply and a power input node of a memory device. In various examples, the power switching circuitry 405 may be a part of a memory system or a memory device, or the power switching circuitry 405 may be part of circuitry separate from a memory device (e.g., electrically coupled between the power supply and the memory device, mounted on a same substrate as the power supply and the memory device, configured as part of a power supply circuit). The power switching circuitry 405 may include a power supply voltage evaluation component 410, a power supply switching component 415, an isolation duration component 420, a power supply command receiver component 425, a power supply status indication component 430, and a secondary power switching component 435. Each of these modules may communicate, directly or indirectly, with one another (e.g., via one or more buses).

The power supply voltage evaluation component 410 may evaluate or measure a voltage level of one or more power supplies. In some examples, the power supply voltage evaluation component 410 may determine that a first voltage level of a power supply satisfies a first voltage threshold. In some examples, the power supply voltage evaluation component 410 may determine that a second voltage level of the power supply satisfies a second voltage threshold.

The power supply switching component 415 may support selectively coupling (e.g., selectively connecting) or selectively isolating (e.g., selectively disconnecting) a power input node of a memory device and the power supply. In some examples, the power supply switching component 415 may couple the power input node of the memory device with the power supply based on determining that the first voltage level of the power supply satisfies the first voltage threshold. In some examples, the power supply switching component 415 may isolate the power input node of the memory device from the power supply based on determining that the second voltage level of the power supply satisfies the second voltage threshold. In some examples, the power supply switching component 415 may isolate the power input node of the memory device from the power supply for a power cycle duration, which may or may not be based on receiving a power cycle command.

In some examples, the isolation duration component 420 may support the power supply switching component 415 isolating the power input node of the memory device from the power supply for a power cycle duration based on determining that the second voltage level of the power supply satisfies the second voltage threshold.

In some examples, the power supply command receiver component 425 may receive a power cycle command, and the power supply switching component 415 may isolate the power input node of the memory device from the power supply for a power cycle duration based on the power supply command receiver component 425 receiving the power cycle command.

The power supply status indication component 430 may signal, to a host device, that the power input node of the memory device was isolated from the power supply.

In some examples, the secondary power switching component 435 may isolate a second power input node of the memory device from a second power supply based on determining that the second voltage level of the power supply satisfies the second voltage threshold. In some examples, the secondary power switching component 435 may couple the second power input node of the memory device with the second power supply based on the first voltage level of the power supply satisfying the first voltage threshold.

Figure 5:
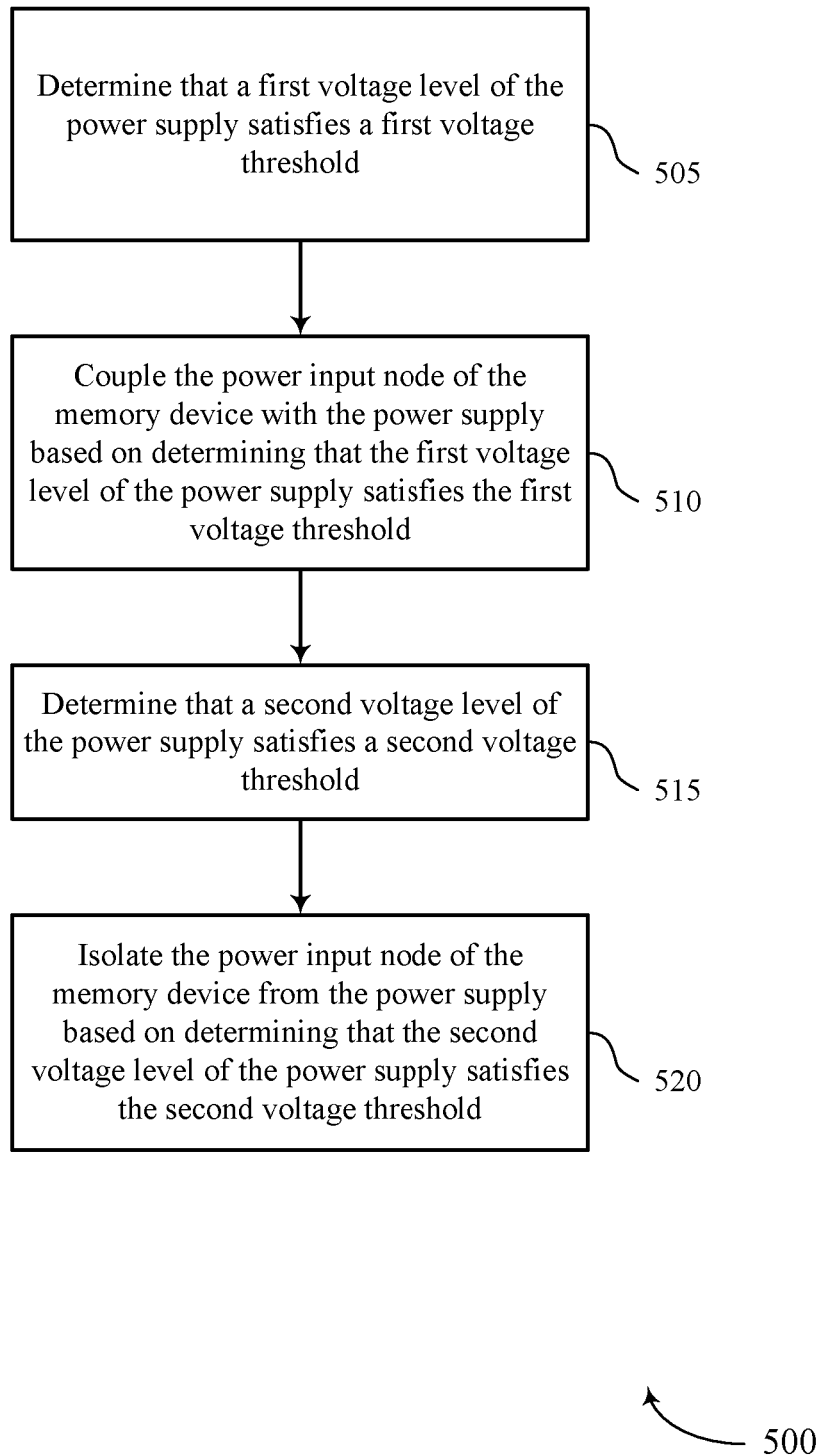
FIG. 5 shows a flowchart illustrating a method or methods that support power switching for embedded memory in accordance with examples as disclosed herein.

FIG. 5 shows a flowchart illustrating a method or methods 500 that supports power switching for embedded memory in accordance with examples as disclosed herein. The operations of method 500 may be implemented by a power switching circuitry or its components as described herein. For example, the operations of method 500 may be performed by power switching circuitry as described with reference to FIG. 4. The power switching circuitry may be coupled with a power supply and a power input node of a memory device. In various examples, the power switching circuitry may be a part of a memory system or memory device, or the power switching circuitry may be part of circuitry separate from a memory device (e.g., electrically coupled between the power supply and the memory device, mounted on a same substrate as the power supply and the memory device, configured as part of a power supply circuit). Aspects of the method or methods 500 may be implemented by a controller, among other components. Additionally or alternatively, aspects of the method or methods 500 may be implemented as instructions stored in memory (e.g., firmware stored in a memory coupled with power switching circuitry). For example, the instructions, when executed by a controller (e.g., the power switching circuitry), may cause the controller or other functional elements to perform the operations of the method or methods 500. Additionally or alternatively, power switching circuitry may perform aspects of the described functions using special-purpose hardware.

At 505, the method 500 may include determining (e.g., at the memory power switching circuitry) that a first voltage level of the power supply satisfies a first voltage threshold. The operations of 505 may be performed according to the methods described herein. In some examples, aspects of the operations of 505 may be performed by a power supply voltage evaluation component as described with reference to FIG. 4.

At 510, the method 500 may include coupling (e.g., via the memory power switching circuitry) the power input node of the memory device with the power supply based on determining that the first voltage level of the power supply satisfies the first voltage threshold. The operations of 510 may be performed according to the methods described herein. In some examples, aspects of the operations of 510 may be performed by a power supply switching component as described with reference to FIG. 4.

At 515, the method 500 may include determining (e.g., at the memory power switching circuitry) that a second voltage level of the power supply satisfies a second voltage threshold. The operations of 515 may be performed according to the methods described herein. In some examples, aspects of the operations of 515 may be performed by a power supply voltage evaluation component as described with reference to FIG. 4.

At 520, the method 500 may include isolating (e.g., via the memory power switching circuitry) the power input node of the memory device from the power supply based on determining that the second voltage level of the power supply satisfies the second voltage threshold. The operations of 520 may be performed according to the methods described herein. In some examples, aspects of the operations of 520 may be performed by a power supply switching component as described with reference to FIG. 4.

In some examples, an apparatus as described herein may perform a method or methods, such as the method 500. The apparatus may include features, means, or instructions (e.g., a non-transitory computer-readable medium storing instructions executable by a processor) for determining, at circuitry coupled with a power supply and a power input node of a memory device, that a first voltage level of the power supply satisfies a first voltage threshold, coupling the power input node of the memory device with the power supply based on determining that the first voltage level of the power supply satisfies the first voltage threshold, determining, at the circuitry, that a second voltage level of the power supply satisfies a second voltage threshold, and isolating the power input node of the memory device from the power supply based on determining that the second voltage level of the power supply satisfies the second voltage threshold.

Some examples of the method 500 and the apparatus described herein may further include operations, features, means, or instructions for maintaining isolation of the power input node of the memory device from the power supply for a power cycle duration based on determining that the second voltage level of the power supply satisfies the second voltage threshold.

Some examples of the method 500 and the apparatus described herein may further include operations, features, means, or instructions for receiving a power cycle command, and isolating the power input node of the memory device from the power supply for a power cycle duration based on receiving the power cycle command.

Some examples of the method 500 and the apparatus described herein may further include operations, features, means, or instructions for signaling, to a host device, that the power input node of the memory device was isolated from the power supply.

Some examples of the method 500 and the apparatus described herein may further include operations, features, means, or instructions for isolating a second power input node of the memory device from a second power supply based on determining that the second voltage level of the power supply satisfies the second voltage threshold.

Some examples of the method 500 and the apparatus described herein may further include operations, features, means, or instructions for coupling the second power input node of the memory device with the second power supply based on the first voltage level of the power supply satisfying the first voltage threshold.

It should be noted that the methods described above describe possible implementations, and that the operations and the steps may be rearranged or otherwise modified and that other implementations are possible. Further, portions from two or more of the methods may be combined.

An apparatus is described. The apparatus may include circuitry configured to be coupled with a power supply and a power input node of a memory device. In some examples, the circuitry may be configured to selectively couple the power input node of the memory device with the power supply based on a first voltage level of the power supply satisfying a first voltage threshold. Additionally or alternatively, the circuitry may be configured to selectively isolate the power input node of the memory device from the power supply based on a second voltage level of the power supply satisfying a second voltage threshold.

In some examples of the apparatus, to isolate the power input node of the memory device from the power supply, the circuitry may be configured to isolate the power input node of the memory device from the power supply for a power cycle duration based on the second voltage level of the power supply satisfying the second voltage threshold.

In some examples of the apparatus, the circuitry may be further configured to receive a power cycle command, and isolate the power input node of the memory device from the power supply for a power cycle duration based on receiving the power cycle command.

In some examples of the apparatus, the circuitry may be further configured to signal, to a host device, that the power input node of the memory device was isolated from the power supply.

In some examples of the apparatus, the circuitry may be further configured to signal, to a host device, an indication to perform a reinitialization of the memory device based on an isolation of the power input node of the memory device from the power supply.

Some examples of the apparatus may include second circuitry configured to be coupled with a second power supply and a second power input node of the memory device. In some examples, the second circuitry may be configured to selectively isolate the second power input node of the memory device from the second power supply based at least in part on the second voltage level of the power supply satisfying the second voltage threshold. Additionally or alternatively, in some examples, the second circuitry may be configured to selectively couple the second power input node of the memory device with the second power supply based at least in part on the first voltage level of the power supply satisfying the first voltage threshold.

In some examples of the apparatus, the circuitry may be further configured to selectively couple the power input node of the memory device with an energy storage element of the apparatus based on the second voltage level of the power supply satisfying the second voltage threshold.

In some examples of the apparatus, the circuitry may be further configured to signal a reset indication to the memory device before isolating the power input node of the memory device from the power supply.

In some examples of the apparatus, to isolate the power input node of the memory device from the power supply, the circuitry may be configured to selectively isolate the power input node of the memory device from the power supply based on the second voltage level of the power supply falling below the second voltage threshold.

In some examples of the apparatus, to couple the power input node of the memory device with the power supply, the circuitry may be configured to selectively couple the power input node of the memory device with the power supply based on the first voltage level of the power supply rising above the first voltage threshold.

Some examples of the apparatus may include one or more integrated circuit components each having a respective power input node that is coupled with (e.g., directly coupled with, connected to) the power supply.

An apparatus is described. The apparatus may include a memory device including a memory array and a power input node, and a power supply. In some examples, the apparatus may include circuitry configured to cause the apparatus to selectively couple the power input node with the power supply based at least in part on a first voltage level of the power supply satisfying a first voltage threshold. Additionally or alternatively, in some examples, the apparatus may include circuitry configured to selectively isolate the power input node from the power supply based at least in part on a second voltage level of the power supply satisfying a second voltage threshold.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   circuitry configured to be coupled with a power supply and a power input node of a memory device, the circuitry configured to:
   selectively couple the power input node of the memory device with the power supply based at least in part on a first voltage level of the power supply satisfying a first voltage threshold; and
   selectively isolate the power input node of the memory device from the power supply based at least in part on a second voltage level of the power supply satisfying a second voltage threshold.

2. The apparatus of claim 1, wherein, to isolate the power input node of the memory device from the power supply, the circuitry is configured to:

isolate the power input node of the memory device from the power supply for a power cycle duration based at least in part on the second voltage level of the power supply satisfying the second voltage threshold.

3. The apparatus of claim 1, wherein the circuitry is further configured to:
receive a power cycle command; and
isolate the power input node of the memory device from the power supply for a power cycle duration based at least in part on receiving the power cycle command.

4. The apparatus of claim 1, wherein the circuitry is further configured to:
signal, to a host device, that the power input node of the memory device was isolated from the power supply.

5. The apparatus of claim 1, wherein the circuitry is further configured to:
signal, to a host device, an indication to perform a reinitialization of the memory device based at least in part on an isolation of the power input node of the memory device from the power supply.

6. The apparatus of claim 1, further comprising:
second circuitry configured to be coupled with a second power supply and a second power input node of the memory device, the second circuitry configured to:
selectively isolate the second power input node of the memory device from the second power supply based at least in part on the second voltage level of the power supply satisfying the second voltage threshold.

7. The apparatus of claim 1, further comprising:
second circuitry configured to be coupled with a second power supply and a second power input node of the memory device, the second circuitry configured to:
selectively couple the second power input node of the memory device with the second power supply based at least in part on the first voltage level of the power supply satisfying the first voltage threshold.

8. The apparatus of claim 1, wherein the circuitry is further configured to:
selectively couple the power input node of the memory device with an energy storage element of the apparatus based at least in part on the second voltage level of the power supply satisfying the second voltage threshold.

9. The apparatus of claim 1, wherein the circuitry is further configured to:
signal a reset indication to the memory device before isolating the power input node of the memory device from the power supply.

10. The apparatus of claim 1, wherein, to isolate the power input node of the memory device from the power supply, the circuitry is configured to:
selectively isolate the power input node of the memory device from the power supply based at least in part on the second voltage level of the power supply falling below the second voltage threshold.

11. The apparatus of claim 1, wherein, to couple the power input node of the memory device with the power supply, the circuitry is configured to:
selectively couple the power input node of the memory device with the power supply based at least in part on the first voltage level of the power supply rising above the first voltage threshold.

12. The apparatus of claim 1, wherein the circuitry is electrically coupled between the power supply and the memory device and mounted on a same substrate as the power supply and the memory device.

13. The apparatus of claim 1, wherein the circuitry is in the memory device.

14. The apparatus of claim 1, further comprising:
one or more integrated circuit components each having a respective power input node that is coupled with the power supply.

15. A method, comprising:
determining, at circuitry coupled with a power supply and a power input node of a memory device, that a first voltage level of the power supply satisfies a first voltage threshold;
coupling the power input node of the memory device with the power supply based at least in part on determining that the first voltage level of the power supply satisfies the first voltage threshold;
determining, at the circuitry, that a second voltage level of the power supply satisfies a second voltage threshold; and
isolating the power input node of the memory device from the power supply based at least in part on determining that the second voltage level of the power supply satisfies the second voltage threshold.

16. The method of claim 15, further comprising:
maintaining isolation of the power input node of the memory device from the power supply for a power cycle duration based at least in part on determining that the second voltage level of the power supply satisfies the second voltage threshold.

17. The method of claim 15, further comprising:
receiving a power cycle command; and
isolating the power input node of the memory device from the power supply for a power cycle duration based at least in part on receiving the power cycle command.

18. The method of claim 15, further comprising:
signaling, to a host device, that the power input node of the memory device was isolated from the power supply.

19. The method of claim 15, further comprising:
isolating a second power input node of the memory device from a second power supply based at least in part on determining that the second voltage level of the power supply satisfies the second voltage threshold; and
coupling the second power input node of the memory device with the second power supply based at least in part on the first voltage level of the power supply satisfying the first voltage threshold.

20. An apparatus, comprising:
a memory device comprising a memory array and a power input node;
a power supply; and
circuitry configured to cause the apparatus to:
selectively couple the power input node with the power supply based at least in part on a first voltage level of the power supply satisfying a first voltage threshold; and
selectively isolate the power input node from the power supply based at least in part on a second voltage level of the power supply satisfying a second voltage threshold.

* * * * *